(12) United States Patent
Lee et al.

(10) Patent No.: US 8,674,344 B2
(45) Date of Patent: *Mar. 18, 2014

(54) DISPLAY DEVICE AND ORGANIC LIGHT EMITTING DIODE DISPLAY

(75) Inventors: Jung-Min Lee, Yongin (KR); Choong-Ho Lee, Yongin (KR); Kie Hyun Nam, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 281 days.

This patent is subject to a terminal disclaimer.

(21) Appl. No.: 13/064,865

(22) Filed: Apr. 21, 2011

(65) Prior Publication Data

US 2012/0091484 A1 Apr. 19, 2012

(30) Foreign Application Priority Data

Oct. 19, 2010 (KR) .................. 10-2010-0101930

(51) Int. Cl.
*H01L 29/08* (2006.01)
*G09G 3/06* (2006.01)

(52) U.S. Cl.
USPC .......... 257/40; 257/88; 257/98; 257/E51.018; 345/44; 313/504

(58) Field of Classification Search
CPC ............... H01L 27/3276; G06F 1/1601
USPC ............ 257/40, 88, 98, E51.018, E51.02; 345/36, 39, 44, 45, 46; 313/504
See application file for complete search history.

(56) References Cited

U.S. PATENT DOCUMENTS

| 6,989,571 | B2 * | 1/2006 | Park et al. ................. 257/350 |
| 6,998,776 | B2 | 2/2006 | Aitken et al. |
| 7,537,504 | B2 | 5/2009 | Becken et al. |
| 7,990,061 | B2 * | 8/2011 | Kim ........................ 313/512 |
| 2005/0139821 | A1 * | 6/2005 | Park ......................... 257/40 |
| 2007/0177069 | A1 * | 8/2007 | Lee .......................... 349/56 |
| 2008/0239637 | A1 * | 10/2008 | Sung et al. ............... 361/681 |
| 2012/0104420 | A1 * | 5/2012 | Lee et al. .................. 257/88 |

FOREIGN PATENT DOCUMENTS

| JP | 2001-052858 | 2/2001 |
| KR | 10-2003-0083528 A | 10/2003 |
| KR | 10-2006-0065367 A | 6/2006 |
| KR | 10-2006-0089977 A | 8/2006 |
| KR | 10-2008-0088013 A | 10/2008 |

* cited by examiner

*Primary Examiner* — Kenneth Parker
*Assistant Examiner* — Jose R Diaz
(74) *Attorney, Agent, or Firm* — Lee & Morse, P.C.

(57) ABSTRACT

A display device includes: a display substrate; a display formed on the display substrate; an encapsulation substrate affixed to the display substrate by an adhering layer surrounding the display, the display substrate including a composite member including a resin matrix and a plurality of carbon fibers and an insulation member attached to an edge of the composite member and forming a through hole; a metal layer positioned on a side of the encapsulation substrate facing the substrate; and a conductive connector filling the through hole and contacting the metal layer. The composite member is stacked with at least two layers with different sizes, and the insulation member contacts sides of the at least two layers and has the same thickness as the composite member.

23 Claims, 19 Drawing Sheets

DISPLAY DEVICE AND ORGANIC LIGHT EMITTING DIODE DISPLAY

RELATED APPLICATIONS

This application claims priority to and the benefit of Korean Patent Application No. 10-2010-0101930 filed in the Korean Intellectual Property Office on Oct. 19, 2010, the entire contents of which are incorporated herein by reference.

BACKGROUND

1. Field

The described technology relates generally to a display device. More particularly, the described technology relates generally to an organic light emitting diode (OLED) display. Further, the described technology relates generally to an encapsulation substrate for sealing a display.

2. Description of the Related Art

An organic light emitting diode (OLED) display among display devices is flat and emits it own light.

An organic light emitting diode (OLED) display is a self-light-emitting display that is provided with an organic light emitting diode that emits its own light to display an image.

The above information disclosed in this Background section is only for enhancement of understanding of the background of the described technology and therefore it may contain information that does not form the prior art that is already known in this country to a person of ordinary skill in the art.

SUMMARY

According to an exemplary embodiment, there is provided a display device including a display substrate, a display disposed on the display substrate; an encapsulation substrate affixed to the substrate by an adhering layer surrounding the display, the encapsulation substrate including a composite member including a resin matrix and a plurality of carbon fibers, and an insulation member attached to an edge of the composite member and including at least one through hole, a metal layer positioned on a side of the encapsulation substrate facing the display substrate, and a conductive connector filling the through hole and contacting the metal layer, wherein the composite member is stacked with at least two layers having different sizes, and the insulation member contacts sides of the at least two layers and has a same thickness as the composite member.

The carbon fibers may cross each other in the resin matrix.

The composite member may include a first layer and a second layer having different sizes. The first layer and the second layer of the composite member may be configured with a plurality of sheets. The sheets may each include the resin matrix and the plurality of carbon fibers.

Carbon fibers disposed in at least one of the plurality of sheets and carbon fibers disposed in at least another one of the plurality of sheets may cross each other.

The insulation member may include a third layer that contacts the first layer of the composite member and that is in parallel with the first layer, and a fourth layer that contacts the second layer of the composite member and that is parallel with the second layer. The third layer and the fourth layer respectively of the insulation member may include a resin matrix and a plurality of reinforced fibers.

Reinforced fibers disposed in the third layer of the insulation member and reinforced fibers disposed in the fourth layer of the insulation member may cross each other.

The third layer and the fourth layer of the insulation member may be configured with a plurality of sheets. The sheets may each include a resin matrix and a plurality of reinforced fibers. Reinforced fibers disposed in at least one of the plurality of sheets and reinforced fibers disposed in at least another one of the plurality of sheets may cross each other.

The insulation member may include one of plastic, glass, and a reinforced fiber composite material. Reinforced fiber of the reinforced fiber composite material may include one of a glass fiber and an aramid fiber.

The insulation member may have a first through hole and a second through hole. The display device may further includes a first conductor disposed over an inner side and an outer side of the encapsulation substrate and through the first through hole, the first conductor receiving a first electric signal, and a second conductor disposed over an inner side and an outer side of the encapsulation substrate and through the second through hole, the second conductor receiving a second electric signal.

According to an exemplary embodiment, there is provided an organic light emitting diode (OLED) display including a display substrate, a display disposed on the display substrate and including a common power line and a common electrode, an encapsulation substrate attached to the display substrate by an adhering layer surrounding the display, the encapsulation substrate including a composite member including a resin matrix and a plurality of carbon fibers, and an insulation member attached to an edge of the composite member and forming a first through hole and a second through hole, a first conductor disposed on an inner side and an outer side of the encapsulation substrate and through the first through hole, the first conductor supplying a first electric signal to the common power line, and a second conductor disposed on an inner side and an outer side of the encapsulation substrate and through the second through hole, the second conductor supplying a second electric signal to the common electrode. The composite member may be stacked with at least two layers having different sizes, and the insulation member may contact sides of the at least two layers and has a same thickness as the composite member.

The OLED display may further include a pad positioned peripherally outward from the display, and including a first pad connected to the common power line and a second pad connected to the common electrode, and a conductive adhering layer positioned between the first pad and the first conductor and between the second pad and the second conductor.

The common power line may include a first common power line and a second common power line crossing each other. The first pad and the second pad may be alternately and repeatedly disposed in a direction of the substrate.

The conductive adhering layer may have electrical conductivity in a thickness direction, and may have an insulation characteristic in a direction other than the thickness direction.

The OLED display may further include a first pad positioned on an outer part of the display and connected to the common power line, and a conductive adhering layer positioned between the first pad and the first conductor. The second conductor may be attached to the common electrode.

The OLED may further include a plurality of spacers positioned on the bottom of the common electrode in the display. The common electrode may have a protrusion corresponding to the spacer.

The first conductor may include a first inner layer disposed on an inner part of the insulation member, a first connector filling in the first through hole, and a first outer layer disposed on an outer part of the insulation member. The second conductor may include a second inner layer disposed over an inner part of the insulation member and an inner part of the composite member, a second connector filling in the second through hole, and a second outer layer disposed on an outer part of the insulation member.

The second inner layer may contact the adhering layer and face the display. The first inner layer may be positioned to be spaced apart from the second inner layer on the outer part of the second inner layer.

The second inner layer may include a metal foil including aluminum or copper.

The composite member may include a first layer and a second layer with different sizes. The first layer and the second layer of the composite member may be configured with a plurality of sheets. The sheets may each include the resin matrix and the plurality of carbon fibers.

Carbon fibers disposed in at least one of the plurality of sheets and carbon fibers disposed in at least another one the plurality of sheets may cross each other.

The insulation member may include a third layer that contacts the first layer and that is parallel with the first layer, and a fourth layer that contacts the second layer and that is parallel with the second layer. The third layer and the fourth layer of the insulating member may each include a resin matrix and a plurality of reinforced fibers.

Reinforced fibers disposed in the third layer of the insulating member and reinforced fibers disposed in the fourth layer of the insulating member may cross each other.

The third layer and the fourth layer of the insulation member may be configured with a plurality of sheets. The sheets may each include a resin matrix and a plurality of reinforced fibers. Reinforced fibers disposed in at least one of the plurality of sheets and reinforced fibers disposed in at least another one of the plurality of sheets cross each other.

DETAILED DESCRIPTION

Figure 1:
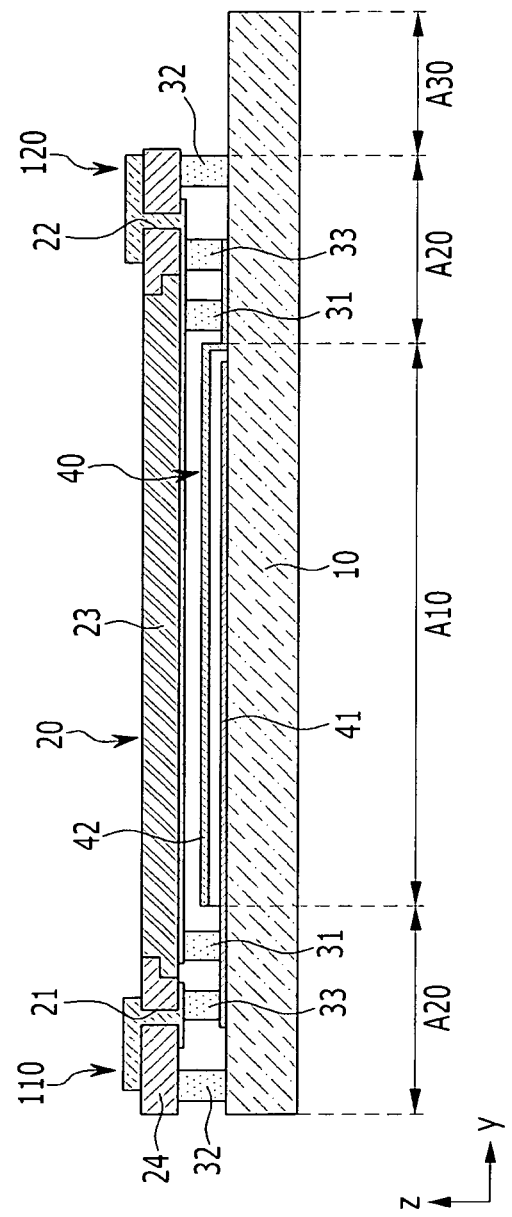
FIG. 1 illustrates a cross-sectional view of an organic light emitting diode (OLED) display according to an exemplary embodiment.

The described embodiments will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. The size and thickness of each component shown in the drawings are arbitrarily shown for understanding and ease of description, but the present invention is not limited thereto.

Through the specification, it will be understood that when an element such as a layer, film, region, or substrate is referred to as being "on" another element, it can be directly on the other element or intervening elements may also be present.

Herein, unless otherwise specified, terms such as "conductive" and "insulating" refer to electrical conductivity and insulation.

Figure 18:
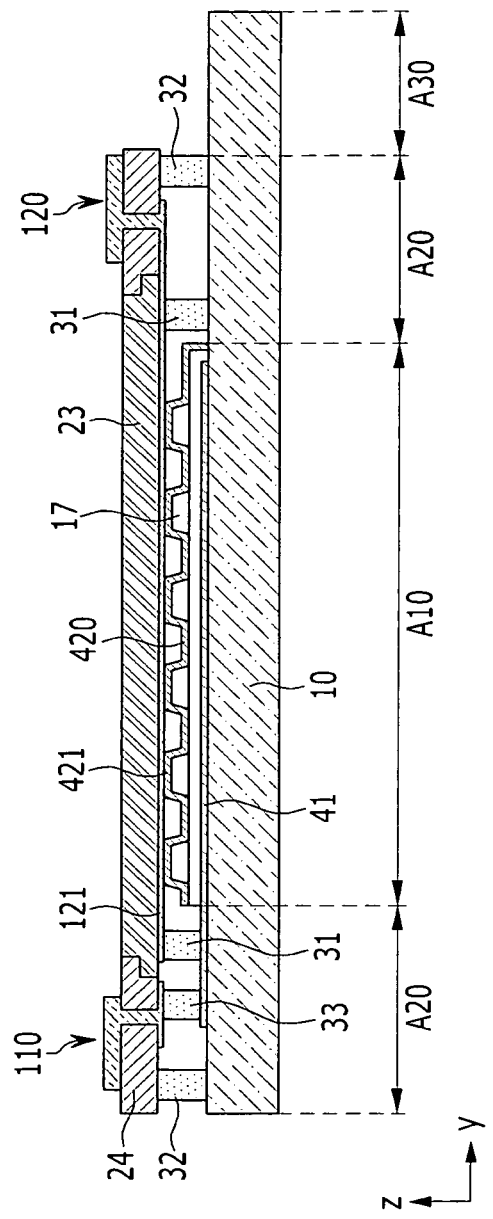
FIG. 18 illustrates a cross-sectional view of an organic light emitting diode (OLED) display according to another exemplary embodiment.

Herein, unless otherwise specified, the terms "inner" and "outer" refer to respective directions toward or away from a center of a described display and perpendicular to a plane of the described display (for example, in the direction of the Z-axis shown in FIGS. 1 and 18. The terms "peripherally inward" and "peripherally outward" refer to respective directions toward or away from a center of a described display in a plane of the described display (for example, in the plane defined by the X-Y-axes shown in FIGS. 2-4 and 9-10.

FIG. 1 illustrates a schematic cross-sectional view of an organic light emitting diode (OLED) display according to an exemplary embodiment.

Referring to FIG. 1, an organic light emitting diode (OLED) display 100 according to the exemplary embodiment includes a display substrate 10, a display unit 40 formed in the display substrate 10, and an encapsulation substrate 20 fixed to the display substrate 10 by adhering layers 31 and 32 enclosing the display unit 40. The display substrate 10 includes a display region A10 where the display unit 40 is located and a non-display region outside of the display region A10. The non-display region may be divided into a wire and sealing region A20 and a pad region A30.

The display 40 includes a plurality of pixels, and has an organic light emitting element and a driving circuit for each pixel. The organic light emitting element includes a pixel electrode, an organic emission layer, and a common electrode 42. The driving circuit is formed of at least two thin film transistors including a switching thin film transistor and a driving thin film transistor, and at least one capacitor.

In addition, gate lines, data lines, and common power lines 41 are arranged in each pixel. The gate line transmits a scan signal and the data line transmits a data signal. The common power line 41 applies a common voltage to the driving thin film transistor. The common power line 41 may be parallel with the data line, or may be formed of a first common power line that is parallel with the data line and a second common power line that is parallel with the gate line.

A detailed description of the display unit 40 will be given below. FIG. 1 schematically illustrates the display unit 40 where the common power lines 41 and the common electrode 42 are formed.

The adhering layers 31 and 32 include a first adhering layer 31 surrounding the display unit 40 and a second adhering layer 32 located peripherally outward from the first adhering layer 31. In addition, a conductive adhering layer 33 is disposed between the first adhering layer 31 and the second adhering layer 32. The first adhering layer 31 and the second adhering layer 32 do not include a conductive material, and may include a thermal hardening resin, such as, for example, an epoxy resin. In addition, a moisture absorbing filler (not shown) is formed between the substrate 10 and the encapsulation substrate 20 at an peripherally inward side of the first adhering layer 31.

In the OLED display 100, the common power line 41 and the common electrode 42 are not connected with a flexible printed circuit (not shown) attached to the pad region A30. The common power line 41 is connected with a first conductor 110 formed in the encapsulation substrate 20 and that receives a first electric signal therefrom, and the common electrode 42 is connected with a second conductor 120 formed in the encapsulation substrate 20 and that receives a second electric signal therefrom.

Thus, the OLED display 100 may evenly apply the corresponding electric signal to the common power line 41 and the common electrode 42 without forming the pad regions A30 at four edges (up, down, right, and left) of the substrate 10. As a result, the entire structure and the manufacturing process of the OLED display 100 may be simplified while providing a large-sized display 40 in which luminance non-uniformity may be prevented.

Figure 2:
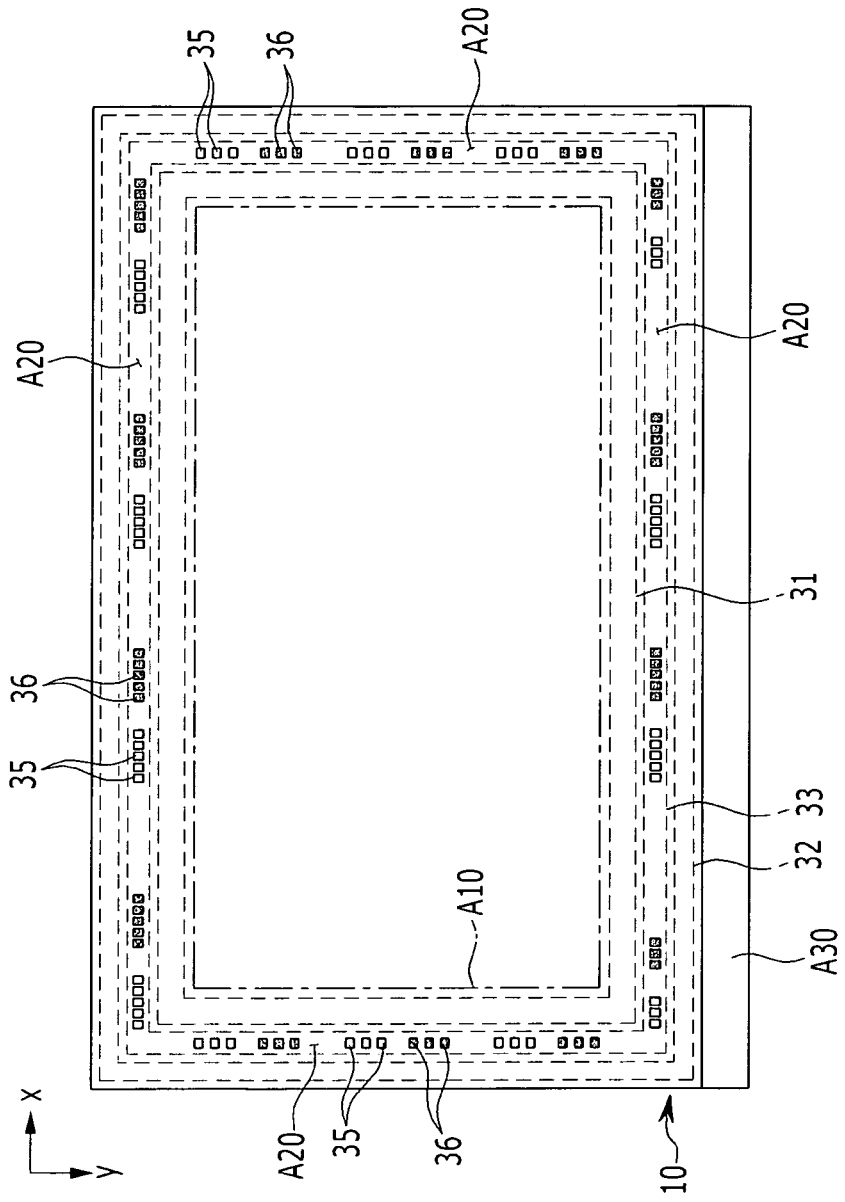
FIG. 2 illustrates a top plan view of a substrate of the organic light emitting diode (OLED) display shown in FIG. 1.

FIG. 2 shows a top plan view of a substrate of the OLED display of FIG. 1.

Referring to FIG. 1 and FIG. 2, the substrate 10 has a rectangular shape with a pair of long edges and a pair of short edges. The wire and sealing region A20 is located peripherally outward from the four edges of the display region A10. In the wire and sealing region A20, the first adhering layer 31, the conductive adhering layer 33, and the second adhering layer 32 are located.

In addition, the pad region A30 is located at one of the edges of the substrate 10 at the peripherally outward side of the wire and sealing region A20. Although FIG. 2 illustrates that the pad region A30 is located at the lower long side of the substrate 10, the location of the pad region A30 is not limited thereto.

A first pad 35 connected with the common power line 41 of the display unit 40 and a second pad 36 connected with the common electrode 42 of the display unit 40 are located in the wire and sealing region A20. The first pad 35 and the second pad 36 are formed at four wire and sealing regions A20, and the first pad 35 and the second pad 36 may be iteratively alternated along a horizontal direction (x-axis direction in the drawing) and a vertical direction (y-axis direction in the drawing) of the substrate 10. For example, groups of the first pad 35 and groups of the second pad 36 may alternate In FIG. 2, the second pad 36 is shown with a dot pattern and the first pad 35 is shown without a dot pattern in order to distinguish between the first pad 35 and the second pad 36. Among a plurality of first pads 35, a first pad 35 located at the long side of the substrate 10 is electrically connected with the first common power line and a first pad 35 located at the short side of the substrate 10 is electrically connected with the second common power line. However, while FIG. 2 exemplarily shows the locations and the number of first and second pads 35 and 36, FIG. 2 is not restrictive.

The first pad 35 and the second pad 36 are formed at the positions corresponding to the conductive adhering layer 33 among the wire and sealing region A20. The conductive adhering layer 33 is conductive in only the thickness direction (z-axis direction of the drawing) and not in other directions. Accordingly, the first pad 35 and the second pad 36 are not short-circuited even though one conductive adhering layer 33 contacts both of the first pad 35 and the second pad 36.

In addition, a conductive adhering layer having conductivity in all directions can be used. In this case, the conductive adhering layer is formed to include a first conductive adhering layer (not shown) positioned in correspondence to the first pad 35 and a second conductive adhering layer (not shown) corresponding to the second pad 36. Here, the first conductive adhering layer and the second conductive adhering layer are positioned with a predetermined distance therebetween so as to prevent short-circuiting.

Figure 3:
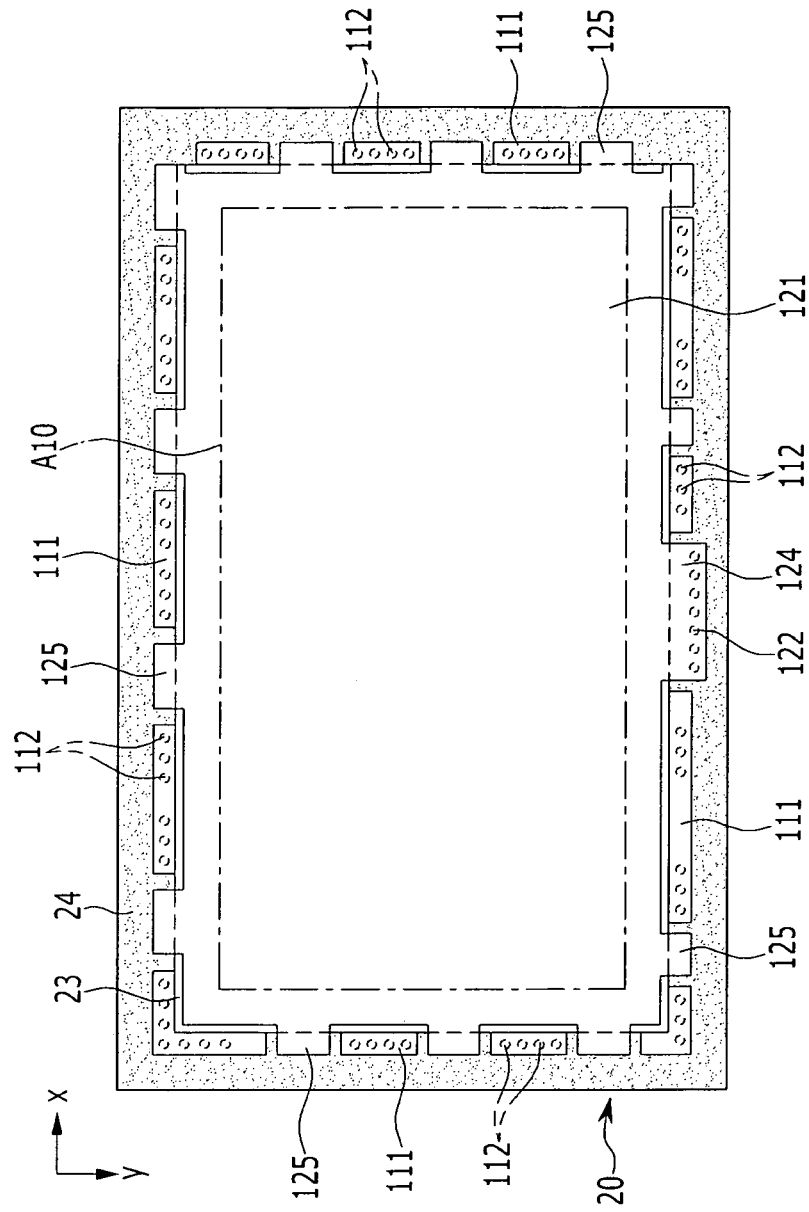
FIG. 3 illustrates a top plan view of an inner surface of an encapsulation substrate of the organic light emitting diode (OLED) display shown in FIG. 1.
Figure 4:
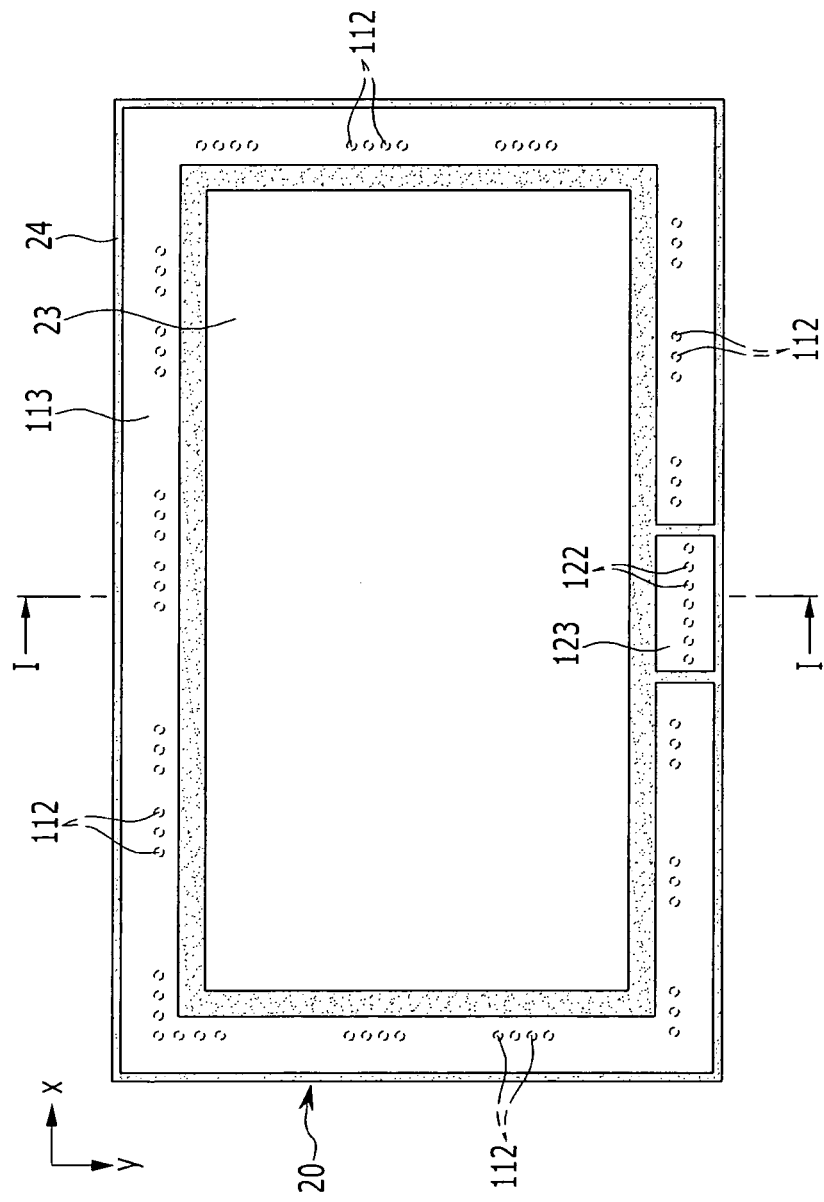
FIG. 4 illustrates a top plan view of an outer surface of an encapsulation substrate of the organic light emitting diode (OLED) display shown in FIG. 1.
Figure 5:
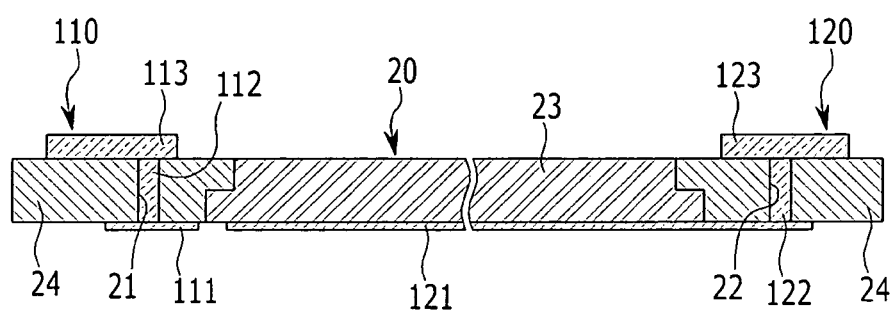
FIG. 5 illustrates a cross-sectional view taken along the line I-I of FIG. 4.

FIG. 3 illustrates a top plan view of an inner surface of an encapsulation substrate of the organic light emitting diode (OLED) display shown in FIG. 1. FIG. 4 illustrates a top plan view of an outer surface of an encapsulation substrate of the organic light emitting diode (OLED) display shown in FIG. 1. FIG. 5 is a cross-sectional view taken along the line I-I of FIG. 4.

Referring to FIG. 1 to FIG. 5, the encapsulation substrate 20 is formed with a size such that the encapsulation substrate 20 covers the display region A10 and the four wire and sealing regions A20 of the substrate 10. Thus, the pad region A30 of the substrate 10 is exposed to the outside without being overlapped with the encapsulation substrate 20.

The encapsulation substrate 20 includes a first through hole 21 for applying an electric signal of the common power line 41 and a second through hole 22 for applying an electric signal of the common electrode 42. A first conductor 110 is formed below the encapsulation substrate 20, in the first through hole 21, and above the encapsulation substrate 20. A second conductor 120 is formed below the encapsulation substrate 20, in the second through hole 22, and above the encapsulation substrate 20.

The encapsulation substrate 20 includes a composite member 23 and an insulation member 24 combined to the outer part of the composite member 23. The composite member 23 includes a resin matrix and a plurality of carbon fibers. The first through hole 21 and the second through hole 22 are formed on the insulation member 24. The first conductor 110 is formed on the insulation member 24, and the second conductor 120 is formed over the composite member 23 and the insulation member 24. The first conductor 110 and the second conductor 120 are positioned with a distance between each other above and below the encapsulation substrate 20.

The composite member 23 faces the display 40 and contacts the first adhering layer 31. The insulation member 24 is fixed to four peripherally outward edges of the composite member 23 and faces the wire and sealing regions A20 on four sides. The insulation member 24 can be made with one of plastic, glass, and a reinforced fiber composite material. The reinforced fiber can be a glass fiber or an aramid fiber. The material of the insulation member 24 is not restricted to the above description.

The composite member 23 can be provided to have a thermal expansion coefficient that is very close to the thermal expansion coefficient of the substrate 10 by controlling the content of the carbon fiber and the resin matrix. Accordingly, when the substrate 10 and the encapsulation substrate 20 are assembled by hardening the first and second adhering layers 31 and 32 and the conductive adhering layer 33 at a high temperature, a bending problem caused by the difference of the thermal expansion coefficients of the two substrates 10 and 20 can be avoided. Also, bending problem during an environmental reliability test after the OLED display is assembled may be avoided.

The composite member 23 has conductivity because of the carbon fiber. If the encapsulation substrate 20 were to be configured with the composite member 23 and the first conductor 110 and the second conductor 120 directly formed on the composite member 23, the first conductor 110 and the second conductor 120 would be short-circuited through the composite member 23. In such a case, before the first conductor 110 and the second conductor 120 are formed on the composite member 23, another process for forming an insulation layer on the surface of the composite member 23 and the first and second through holes 21 and 22 would have to be performed.

However, according to an exemplary embodiment, an insulation member 24 is attached to the edge of the composite member 23 and the first conductor 110 is formed on the insulation member 24 in the organic light emitting diode (OLED) display 100. In this way, the first conductor 110 and the second conductor 120 can be insulated without using an additional insulation means such as the insulation layer. A detailed configuration and material of the composite member 23 and the insulation member 24 will be described below.

The first conductor 110 includes a first inner layer 111 formed inside the insulation member 24, a first connector 112 contacting the first inner layer 111 and filling the first through hole 21, and a first outer layer 113 contacting the first connector 112 and being formed outside the insulation member 24.

The second conductor 120 includes a second inner layer 121 formed inside the insulation member 24 and the composite member 23, a second connector 122 contacting the second inner layer 121 and filling the second through hole 22, and a second outer layer 123 contacting the second connector 122 and being formed outside the insulation member 24.

The second inner layer 121 covers the display 40 and is formed with a size such that the second inner layer 121 contacts the first adhering layer 31. The second inner layer 121 can be formed with a metal layer having low resistance and excellent moisture protection, for example, an aluminum layer, an aluminum alloy layer, a copper layer, or a copper alloy layer. Also, the second inner layer 121 can be formed with a metal foil including aluminum or copper.

The second inner layer 121 is attached to the first adhering layer 31 to cover and protect the display 40 that is peripherally inward from the first adhering layer 31. The second inner layer 121 intercepts penetration of moisture toward the display 40. The moisture and oxygen may be initially intercepted by the composite member 23 having a thick structure, and are subsequently intercepted by the second inner layer 121. Therefore, the composite member 23 on which the second inner layer 121 is formed may provide air-tightness as high as that of a glass substrate.

The second inner layer 121 includes a first extended unit 124 in the insulation member 24 so as to contact the second connector 122, and also includes a plurality of second extended units 125 contacting the conductive adhering layer 33 in the insulation member 24 so as to be overlapped on the second pad 36 of the substrate 10. Hence, the second pad 36 of the substrate 10 is electrically connected to the second inner layer 121 through the conductive adhering layer 33 and the second extended unit 125.

The first inner layer 111 is formed to contact the conductive adhering layer 33 between the second extended units 125 of the second inner layer 121. The first inner layer 111 is divided into multiple inner layers, and is overlapped on the first pad 35 with the conductive adhering layer 33 therebetween. Therefore, the first pad 35 of the substrate 10 is electrically connected to the first inner layer 111 through the conductive adhering layer 33.

Since the second inner layer 121 is formed on the composite member 23, the composite member 23 and the second conductor 120 are electrically connected. Since the insulation member 24 is insulated from the composite member 23 and since the first inner layer 111 and the first and second extended units 124 and 125 are separated on the insulation member 24, the first conductor 110 and the second conductor 120 are not short-circuited.

The first outer layer 113 and the second outer layer 123 are formed with a gap therebetween and are formed on the outside of the insulation member 24. The first outer layer 113 is formed to be overlapped on a plurality of the first inner layers 111, and the second outer layer 123 is formed to contact the second connector 122. For example, as shown in FIG. 4, the second outer layer 123 is formed on a part of the edge of one long edge of the insulation member 24, and the first outer layer 113 is formed on other edges of the insulation member 24.

An external access terminal (not shown) is attached to the first outer layer 113 and the second outer layer 123. Therefore, the first outer layer 113 receives a first electric signal of the common power line 41 from the external access terminal and transmits it to the first inner layer 111, and the second outer layer 123 receives a second electric signal of the common electrode 42 from the external access terminal and transmits it to the second inner layer 121.

In this instance, at least one of the width and thickness of the first outer layer 113 is formed to be greater than the width and thickness of the first inner layer 111. The second outer layer 123 is formed to have thickness greater than the thickness of the second inner layer 121. In all cases, the first inner layer 111 and the second inner layer 121 are formed to have the same thickness, and the first outer layer 113 and the second outer layer 123 are formed to have the same thickness to prevent the generation of steps in the assembly process of the substrate 10 and the encapsulation substrate 20. The above-described configuration is applicable to a large organic light emitting diode (OLED) display with a large current.

Figure 6:
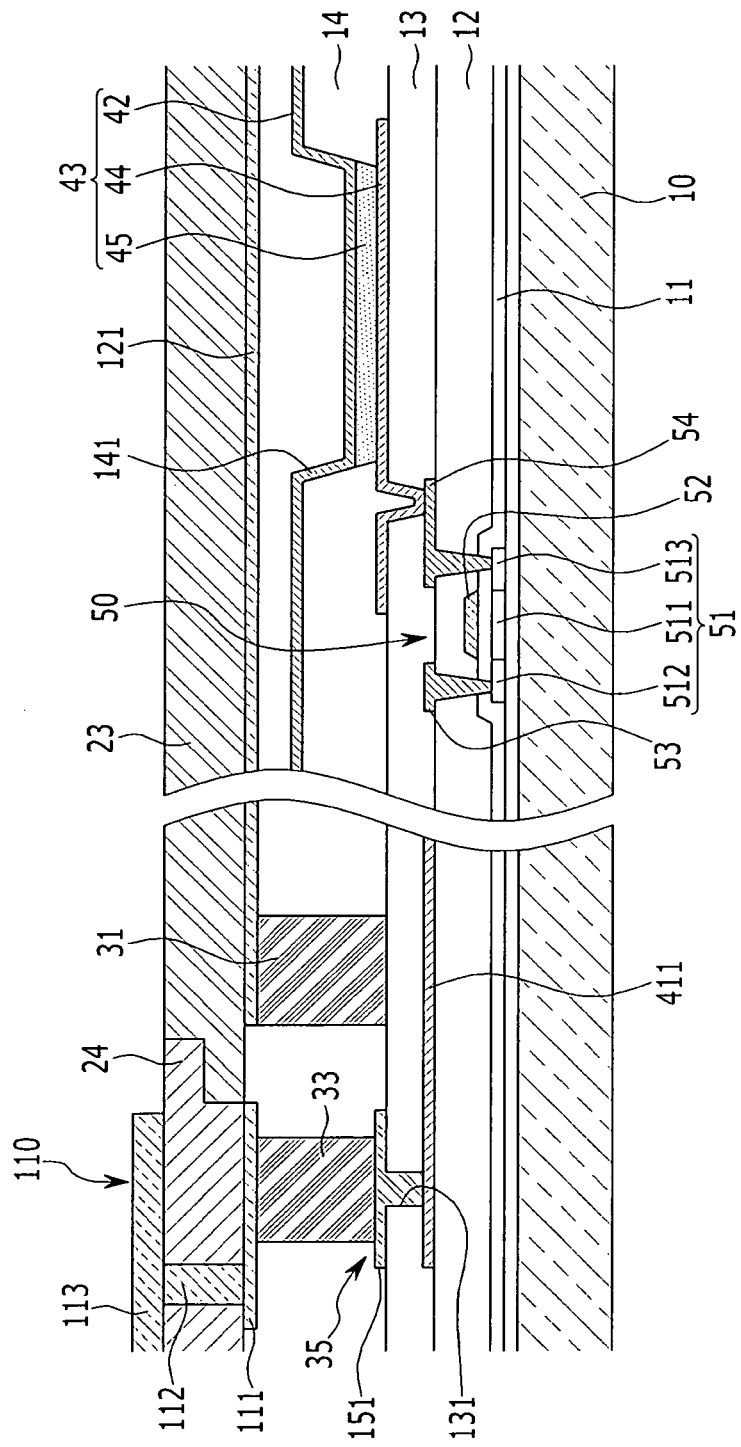
FIG. 6 to FIG. 8 are partial enlarged cross-sectional views of the organic light emitting diode (OLED) display according to the exemplary embodiment of FIG.
Figure 7:
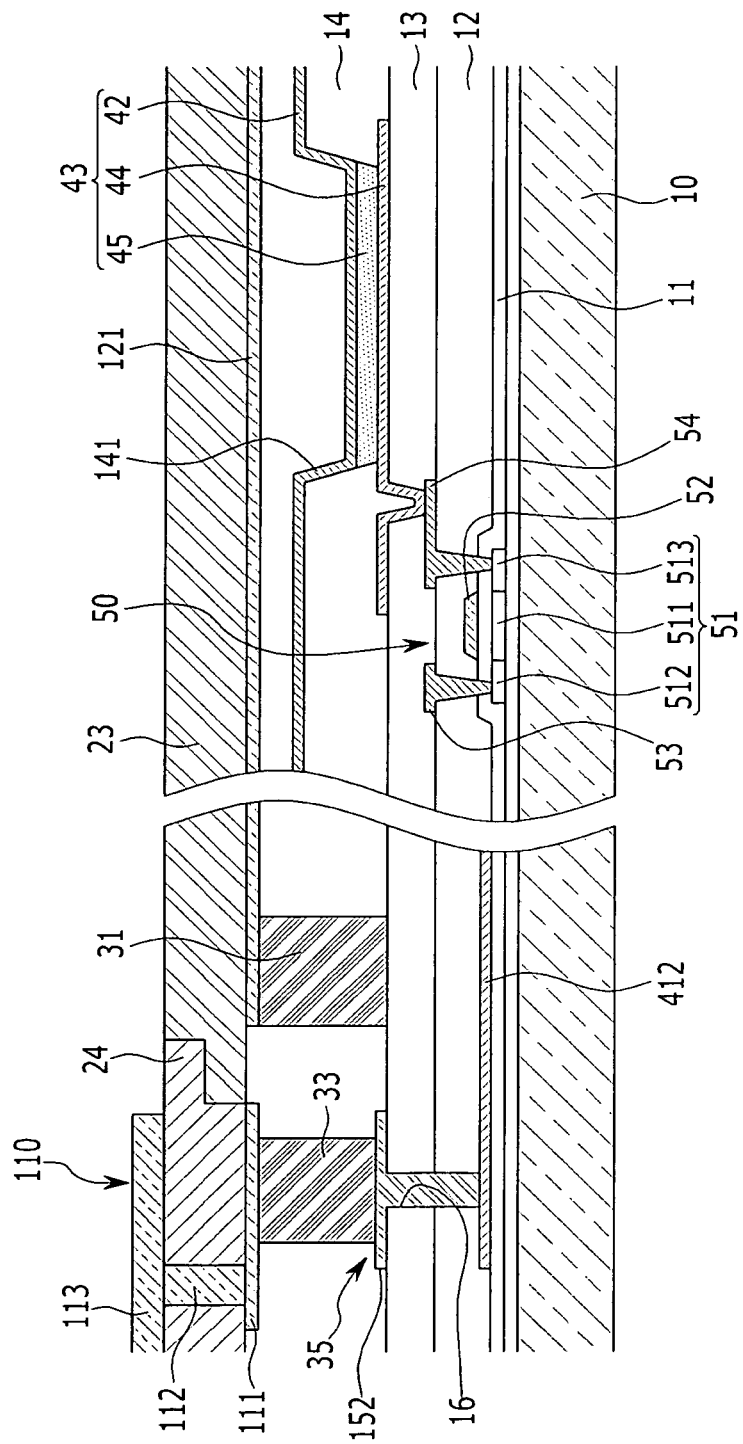
Figure 8:
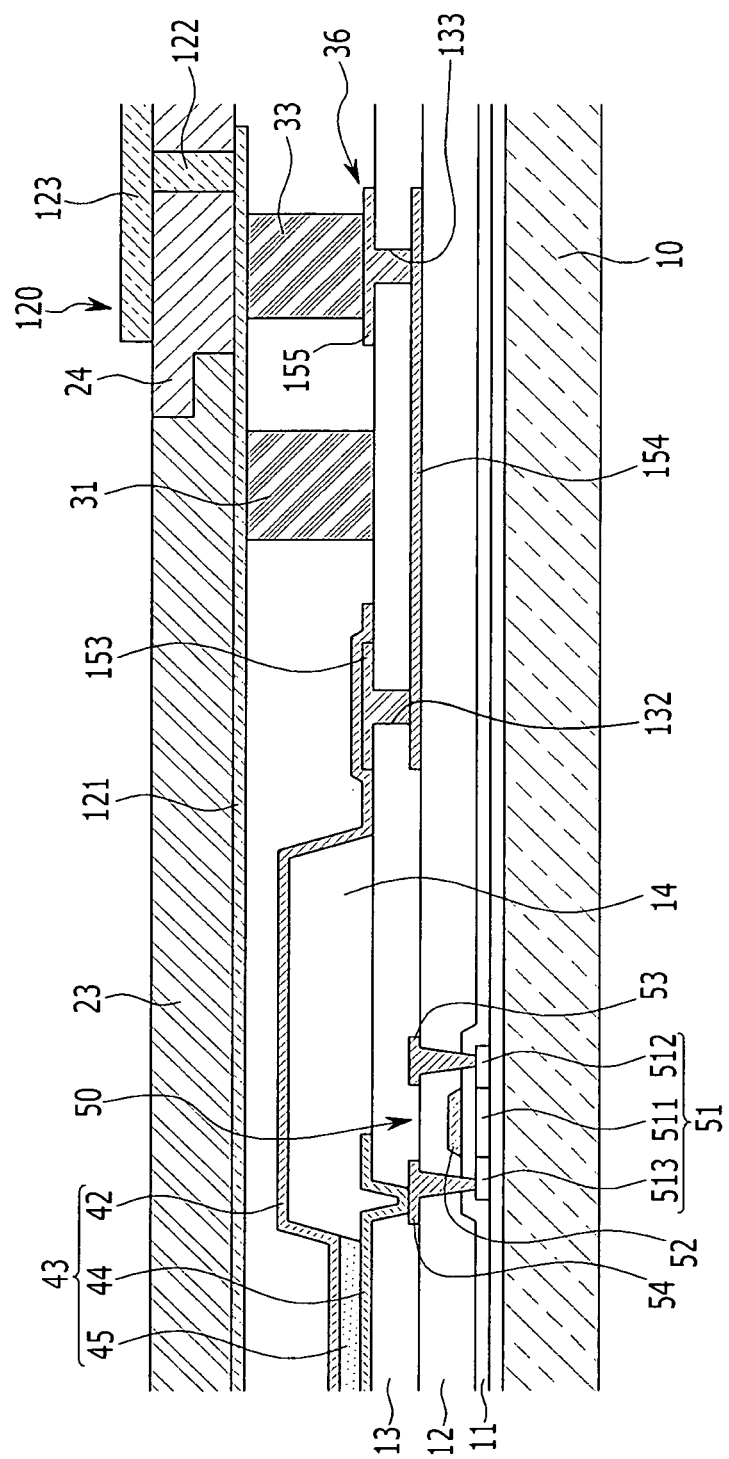

FIG. 6 to FIG. 8 illustrate partial enlarged cross-sectional views of the organic light emitting diode (OLED) display according to the exemplary embodiment. FIG. 6 shows the first common power line and the first pad in detail, and FIG. 7 shows the second common power line and the first pad in detail. FIG. 8 shows the common electrode and the second pad in detail.

Referring to FIG. 6 to FIG. 8, an organic light emitting element 43 and a driving circuit are formed for each pixel in the display 40. The driving circuit includes at least two thin film transistors and at least one capacitor. FIG. 6 to FIG. 8 show one thin film transistor 50 and one organic light emitting element 43 that are positioned on the display 40.

The thin film transistor 50 includes a semiconductor layer 51, a gate electrode 52, a source electrode 53, and a drain electrode 54. The semiconductor layer 51 is formed as a polycrystalline silicon film, and includes a channel area 511, a source area 512, and a drain area 513. The channel area 511 is an intrinsic semiconductor not doped with an impurity, and the source area 512 and the drain area 513 are impurity-doped impurity semiconductors.

The gate electrode 52 is disposed on the channel area 511 of the semiconductor layer 51, interposing a gate insulating layer 11 therebetween. The source electrode 53 and the drain electrode 54 are disposed on the gate electrode 52, interposing an interlayer insulating layer 12 therebetween, and are respectively connected with the source area 512 and the drain area 513 through a contact hole formed in the interlayer insulating layer 12. A planarization layer 13 is formed on the source electrode 53 and the drain electrode 54, and a pixel electrode 44 is formed on the planarization layer 13. The pixel electrode 44 is connected to the drain electrode 54 through a contact hole of the planarization layer 13.

A pixel definition layer 14 is provided on the pixel electrode 44 and the planarization layer 13. The pixel definition layer 14 has a first opening 141 for each pixel, and exposes a part of the pixel electrode 44. An organic emission layer 45 is formed on the exposed pixel electrode 44, and a common electrode 42 is formed on the display 40 to cover the organic emission layer 45 and the pixel definition layer 14. The pixel electrode 44, the organic emission layer 45, and the common electrode 42 configure the organic light emitting element 43.

The pixel electrode 44 may be a hole injection electrode, and the common electrode 42 may be an electron injection electrode. In this instance, the organic emission layer 45 is configured with a hole injection layer (HIL), a hole transport layer (HTL), an emission layer, an electron transport layer (ETL), and an electron injection layer (EIL) that are sequentially stacked from the pixel electrode 44. The holes and the electrons are injected to the organic emission layer 45 from the pixel electrode 44 and the common electrode 42, and light emits when excitons generated by combining the injected holes and electrons are changed to a ground state from an exited state.

The pixel electrode 44 is formed to be a transflective conductive layer, and the common electrode 42 is formed to be a reflective conductive layer. Light output by the organic emission layer 45 is reflected by the common electrode 42 and is output to the outside through the substrate 10. Such a light emission structure is called a rear light emission type. The pixel electrode 44 can be made as three layers of ITO/silver (Ag)/ITO, and the common electrode 42 can include one of silver (Ag), a silver alloy, aluminum (Al), and an aluminum alloy.

A first common power line 411 and a second common power line 412 can be formed in the same layer as one of the gate electrode 52 and the source/drain electrodes 53 and 54. FIG. 5 shows a case in which the first common power line 411 is formed in the same layer as the source/drain electrode 53 and 54 with the same material, and FIG. 6 shows a case in which the second common power line 412 is formed in the same layer as the gate electrode 52 with the same material.

Referring to FIG. 6 and FIG. 7, ends of the first common power line 411 and the second common power line 412 are extended to the wire and sealing region A20 peripherally outward from the display 40. At least one of the four insulation layers formed on the display 40 may be extendible to the wire and sealing region A20. An end of the first common power line 411 can be covered by the planarization layer 13, and an end of the second common power line 412 can be covered by the interlayer insulating layer 12 and the planarization layer 13.

The planarization layer 13 has a second opening 131 to expose the end of the first common power line 411, and a first pad conductive layer 151 is formed on the planarization layer 13. The first pad conductive layer 151 is electrically connected to the first common power line 411 through the second opening 131. The first pad 35 positioned on the long edge of the substrate 10 can be defined to be the first pad conductive layer 151.

The interlayer insulating layer 12 and the planarization layer 13 have a third opening 16 to expose the end of the second common power line 412, and the second pad conductive layer 152 is formed on the planarization layer 13. The second pad conductive layer 152 is electrically connected to the second common power line 412 through the third opening 16. The first pad 35 positioned on the short edge of the substrate 10 can be defined to be a second pad conductive layer 152.

The first pad conductive layer 151 and the second pad conductive layer 152 can be formed in the same layer as the pixel electrode 44 with the same material. Then, the manufacturing stages can be reduced since another patterning process for forming the first and second pad conductive layers 151 and 152 can be omitted.

Referring to FIG. 8, the common electrode 42 is positioned peripherally inward from the first adhering layer 31. The second pad 36 is formed to extend from a peripherally inward side to a peripherally outward side of the first adhering layer 31 to electrically connect the common electrode 42 and the conductive adhering layer 33.

The second pad 36 includes a third pad conductive layer 153, a fourth pad conductive layer 154, and a fifth pad conductive layer 155. The third pad conductive layer 153 is provided at a peripherally inward side of the first adhering layer 31 and contacts the common electrode 42. The fourth pad conductive layer 154 is connected to the third pad conductive layer 153 through a fourth opening 132 of the planarization layer 13, and is positioned to extend from a peripherally inward side to a peripherally outward side of the first adhering layer 31. The fifth pad conductive layer 155 is provided between the conductive adhering layer 33 and the planarization layer 13, and is connected to the fourth pad conductive layer 154 through a fifth opening 133 of the planarization layer 13.

The third pad conductive layer 153 and the fifth pad conductive layer 155 can be formed in the same layer as the pixel electrode 44 with the same material. The fourth pad conductive layer 154 is formed in one of the gate electrode 52 and the source/drain electrode 53 and 54 with the same material. Therefore, the manufacturing stages can be reduced since another patterning process for forming the second pad 36 can be omitted.

FIG. 8 shows the case in which the fourth pad conductive layer 154 is formed in the same layer as the source/drain electrodes 53 and 54. The detailed configuration of the second pad 36 is not restricted to the illustrated embodiment, and any other configurations available for providing a conductive connection between the common electrode 42 of the display 40, and the conductive adhering layer 33 of the wire and sealing region A20 are applicable.

Therefore, the organic light emitting diode (OLED) display 100 according to the exemplary embodiment forms the first conductor 110 and the second conductor 120 on the encapsulation substrate 20 and applies corresponding electric signals to the common power line 41 and the common electrode 42. In this instance, since the encapsulation substrate 20 is not formed with only the composite member 23 but is formed with the combination of the composite member 23 and the insulation member 24, the process for forming the insulation layer to insulate the first conductor 110 and the second conductor 120 can be omitted.

It may be difficult to form a through hole in the composite member 23, because the composite member 23 includes hard carbon fibers. The encapsulation substrate 20 can be easily manufactured by forming the first through hole 21 and the second through hole 22 in the insulation member 24. For example, when the insulation member 24 is manufactured by injection-molding or extrusion-molding plastic, the holes can be formed together, and when the holes are formed in the insulation member 24 in a subsequent process, it is very easy to form the holes in the insulation member 24.

Also, in the organic light emitting diode (OLED) display 100 the bonding force of the composite member 23 and the insulation member 24 may be increased and the thickness of the insulation member 24 may be controlled to be the same as the composite member 23 by configuring the boundary of the composite member 23 and the insulation member 24 as described below. That is, the encapsulation substrate 20 is formed to be planar.

Figure 9:
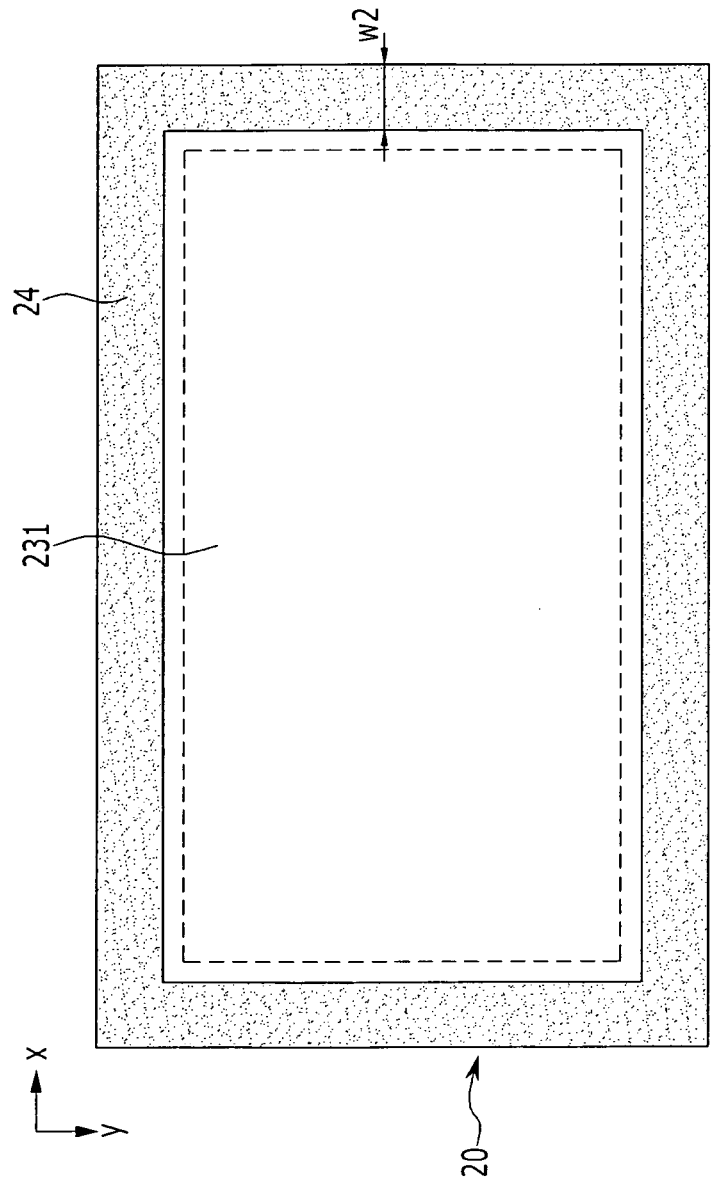
FIG. 9 illustrates a top plan view of a state in which a first conductor and a second conductor are removed from the encapsulation substrate shown in FIG. 3.
Figure 10:
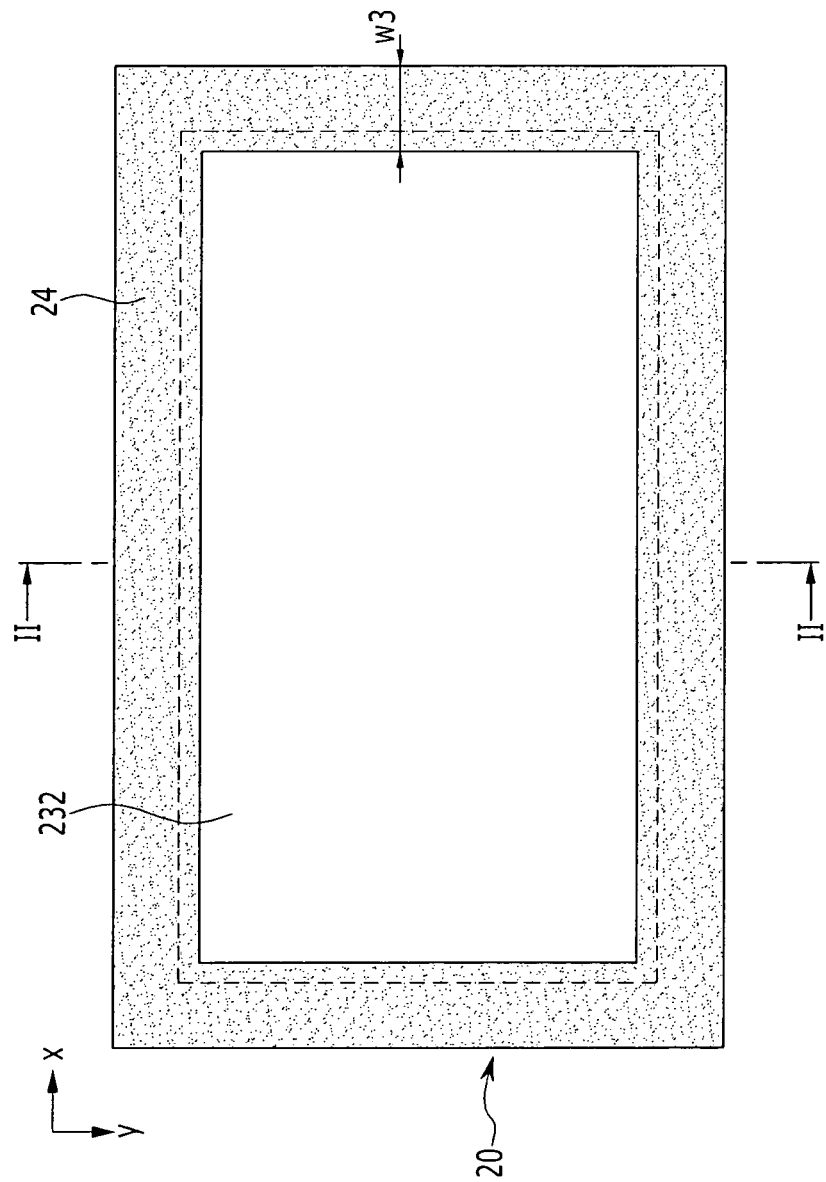
FIG. 10 illustrates a top plan view of a state in which a first conductor and a second conductor are removed from the encapsulation substrate shown in FIG. 4.
Figure 11:
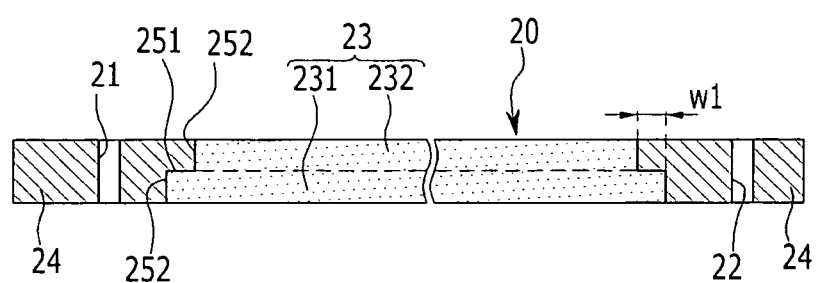
FIG. 11 illustrates a cross-sectional view with respect to a line II-II of FIG. 10.

FIG. 9 and FIG. 10 show top plan views in which the first conductor and the second conductor of encapsulation substrate as illustrated in FIG. 3 and FIG. 4) are not shown. FIG. 11 shows a cross-sectional view with respect to a line II-II of FIG. 10.

Referring to FIG. 9 to FIG. 11, in the organic light emitting diode (OLED) display 100, the composite member 23 is configured with at least two layered structures with different sizes. Herein, the term "with different sizes" may refer to having different areas in the X-Y direction. The insulation member 24 contacts a side of the composite member 23 and has the same thickness as the composite member 23. FIG. 9 to FIG. 11 show the case in which the composite member 23 is a stacked structure of a first layer 231 and a second layer 232. However, the number of stacked composite members 23 is not restricted thereto.

When the composite member 23 is configured with the first layer 231 and the second layer 232, the first layer 231 positioned to face the substrate 10 can be formed to be larger than the second layer 232. In this instance, the second layer 232 is positioned in the center of the first layer 231 so that one side of the first layer 231 may be exposed with a predetermined width w1 (refer to FIG. 11) along the four edges of the composite member 23. The insulation member 24 contacts one side of the first layer 231, that is, a side of the first layer 231 that is not covered by the second layer 232, and sides of the second layer 232, and is formed with the same thickness as the composite member 23.

Therefore, as shown in FIG. 11, regarding the cross-sectional view of the encapsulation substrate 20, the boundary of the composite member 23 and the insulation member 24 includes a horizontal side 251 and two vertical sides 252. The width w3 (refer to FIG. 10) of the insulation member measured on the outer side of the encapsulation substrate 20 is greater than the width w2 (refer to FIG. 9) of the insulation member 24 measured on the inside of the encapsulation substrate 20. Accordingly, the widths of the first outer layer 113 (refer to FIG. 4) and the second outer layer 123 (refer to FIG. 4) positioned on the outer side of the insulation member 24 can be substantially increased. The first layer 231 and the second layer 232 of the composite member 23 can have the same thickness.

The composite member 23 provides good mechanical properties because the composite member 23 includes stiff carbon fibers. Therefore, the composite member 23 may have a thickness that is less than 1 mm. If the composite member 23 were to be configured with a single layer, the boundary of the composite member 23 and the insulation member 24 would have one vertical side, providing a small adhering region. As a result, it would be difficult for the insulation member 24 to be firmly attached to the side of the composite member 23, and the insulation member 24 of the composite member 23 may be separated after the encapsulation substrate 20 is manufactured.

In order to overcome this problem, another process for increasing the bonding force of the encapsulation substrate 20 such as making the insulation member 24 thicker than the composite member 23 or covering a part of the composite member 23 with the insulation member 24 would be needed.

However, since the organic light emitting diode (OLED) display 100 can increase the bonding force of the composite member 23 and the insulation member 24 by increasing the adhering region of the composite member 23 and the insulation member 24, the insulation member 24 can be formed to have the same thickness as the composite member 23, and the composite member 23 is prevented from being separated from the insulation member 24 after the encapsulation substrate 20 is manufactured. Therefore, the organic light emitting diode (OLED) display 100 can increase the accuracy of thickness together with the planarity of the encapsulation substrate 20.

Also, when the insulation member 24 is formed to be thicker than the composite member 23 or a part of the composite member 23 is covered with the insulation member 24, the substrate 10 and the encapsulation substrate 20 may be bent when they are assembled. The organic light emitting diode (OLED) display 100 according to the exemplary embodiment avoids the above-noted problem, since the encapsulation substrate 20 is formed to be planar.

The composite member 23 includes the first layer 231 including a resin matrix and carbon fibers and the second layer 232 including a resin matrix and carbon fibers and having a size that is less than that of the first layer 231. The first layer 231 and the second layer 232 are stacked while controlling their centers. The first layer 231 and the second layer 232 are pressure-baked by using a hot plate. When a part of the injected mold is applied with the hot plate, resin is injected to the edge of the composite member 23 in the extruded mold thereby simultaneously extruding molding the composite member 23 and the insulation member 24.

In addition, the insulation member 24 can be formed with a reinforced fiber composite material. The reinforced fiber may be a glass fiber or an aramid fiber. In this case, the insulation member 24 can be configured with at least a two-layered structure with different sizes in a like manner of the composite member 23. The structure will be described in detail in the second exemplary embodiment and the third exemplary embodiment.

Figure 12:
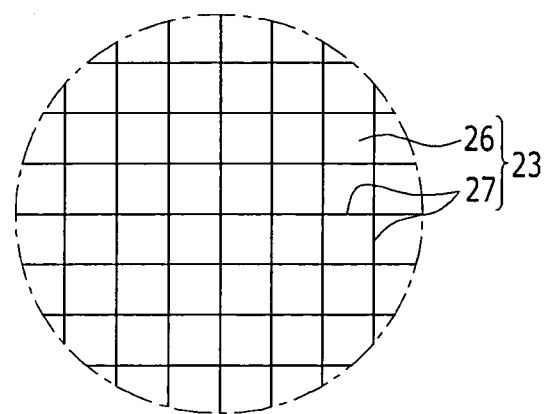
FIG. 12 illustrates a top plan view of magnifying a part of a composite member in the organic light emitting diode (OLED) display shown in FIG. 1.

FIG. 12 shows a top plan view of an enlarged part of a composite member in an organic light emitting diode (OLED) display shown in FIG. 1.

Referring to FIG. 12, the composite member 23 is made of a carbon composite material including a resin matrix 26 and a plurality of carbon fibers 27. The composite member 23 may have a structure in which the carbon fibers 27 are saturated in the resin matrix 26.

The carbon fiber 27 has a lower thermal expansion coefficient than the substrate 10. Particularly, the thermal expansion coefficient in the length direction of the carbon fiber 27 has a negative (−) value. On the other hand, the resin matrix 26 has a higher thermal expansion coefficient than the substrate 10. Thus, the thermal expansion coefficient of the composite member 23 can be controlled by controlling the amount of the carbon fibers 27 and the amount of the resin matrix 26.

That is, when manufacturing the composite member 23 by compounding the carbon fibers 27 and the resin matrix 26, the thermal expansion coefficient of the composite member 23 may be controlled to be equivalent or similar to that of the substrate 10 by controlling a ratio of the resin matrix 26 and the carbon fibers 27.

The carbon fibers 27 do not absorb moisture. Accordingly, the carbon fibers 27 increase the waterproofing ability of the composite member 23. In addition, the composite member 23 including the carbon fibers 27 has excellent mechanical properties so that high mechanical strength can be provided with a small thickness. Therefore, the entire thickness of the organic light emitting diode (OLED) display 100 can be reduced. Also, the thermal expansion of the first inner layer 111 (refer to FIG. 3) and the second inner layer 121 (refer to FIG. 3) of the composite member 23 is suppressed.

The plurality of carbon fibers 27 are arranged to cross each other. For example, the carbon fibers 27 may be woven with wefts and warps. Although FIG. 12 shows the carbon fibers 27 perpendicularly crossing each other, the present invention is not limited to the example shown in FIG. 12, and the carbon fibers 27 may cross each other at predetermined angles other than a right angle. According to the configuration described above, the composite member 23 can have a low thermal expansion coefficient throughout the region and the durability of the composite member 23 can be increased.

Figure 13:
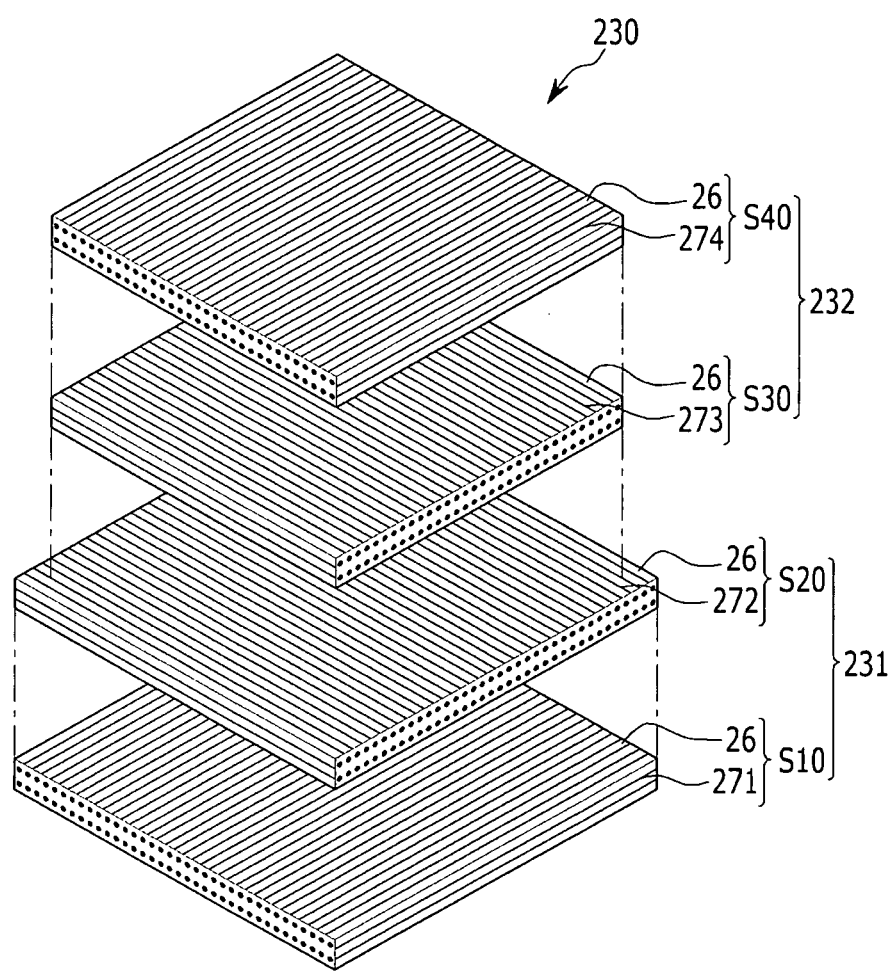
FIG. 13 illustrates an exploded perspective view of a composite member in the organic light emitting diode (OLED) display shown in FIG. 1 as an exemplary variation of FIG. 12.

As an exemplary variation, FIG. 13 illustrates an exploded perspective view of the composite member of the OLED display of FIG. 1.

Referring to FIG. 13, the first layer 231 and the second layer 232 of the composite member 230 are configured as a plurality of sheets. For example, the first layer 231 may have a stacking structure of the first sheet S10 and the second sheet S20, and the second layer 232 may have a stacking structure of the third sheet S30 and the fourth sheet S40. The sheets S10, S20, S30, and S40 include a resin matrix 26 and a plurality of carbon fibers 271, 272, 273, and 274.

The carbon fibers 271 and 274 of the first sheet S10 and the fourth sheet S40 may be arranged in the first direction, and the carbon fibers 272 and 273 of the second sheet S20 and the third sheet S30 may be arranged in the second direction. The first direction and the second direction may or may not perpendicularly cross each other. FIG. 13 exemplarily illustrates that the first direction and the second direction perpendicularly cross each other. When a plurality of carbon fibers 271, 272, 273, and 274 are disposed as above, distortion of the composite member 230 is suppressed to thus increase the planarity of the composite member 230.

In order to control the thermal expansion coefficient of the composite member 230, an angle formed by an arrangement direction of the carbon fibers 271 and 274 in the first sheet S10 and the fourth sheet S40 and the arrangement direction of the carbon fibers 272 and 273 in the second sheet S20 and the third sheet S30 may be set in various ways. The thermal expansion coefficients of the sheets S10, S20, S30, and S40 can be easily controlled by controlling the amount of the resin matrix 26 and the carbon fibers 271, 272, 273, and 274 included in the sheets S10, S20, S30, and S40.

Figure 14:
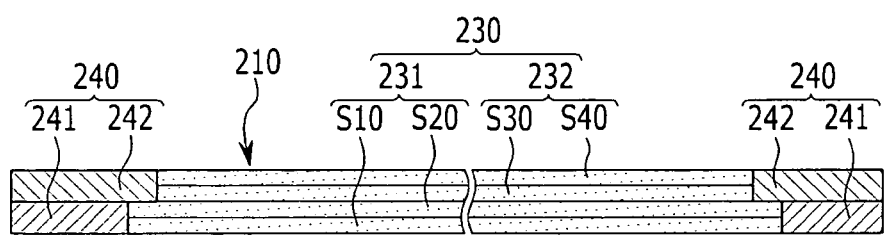
FIG. 14 illustrates a cross-sectional view of an encapsulation substrate of an organic light emitting diode (OLED) display according to another exemplary embodiment.
Figure 15:
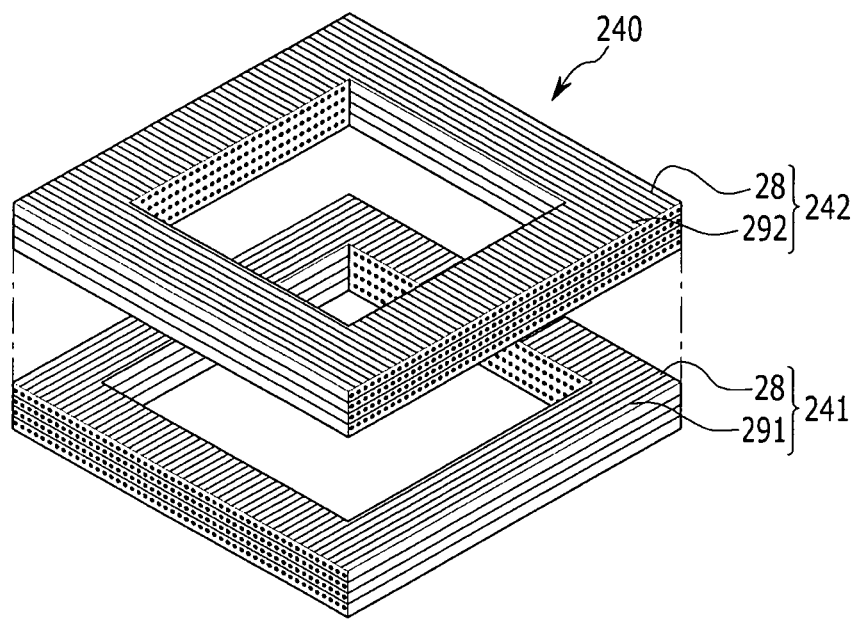
FIG. 15 illustrates an exploded perspective view of an insulation member shown in FIG. 14.

FIG. 14 shows a cross-sectional view of an encapsulation substrate in an organic light emitting diode (OLED) display according to a second exemplary embodiment, and FIG. 15 shows an exploded perspective view of an insulation member shown in FIG. 14. For better understanding and ease of description, the first conductor and the second conductor are not illustrated in FIG. 14, and the first through hole and the second through hole are omitted in FIG. 15.

Referring to FIG. 14 and FIG. 15, the organic light emitting diode (OLED) display according to another exemplary embodiment has the same configuration as the exemplary variation (refer to FIG. 13) according to the exemplary embodiment of FIGS. 1-13, except that an insulation member 240 is manufactured with a reinforced fiber composite material and is formed with a stack structure of at least two layers. The same members as the exemplary variation of the exemplary embodiment of FIGS. 1-13 will have the same reference numerals.

The insulation member 240 is configured by stacking a third layer 241 of the insulation member 240 contacting a side of the first layer 231 of the composite member 230, that is, a side of the first layer 231 that is not covered by the second layer 232 of the composite member 230, and a fourth layer 242 of the insulation member 240 contacting a side of the second layer 232 of the composite member 230. The third layer 241 of the insulation member 240 has the same thickness as the sum of the thickness of the first sheet S10 and the second sheet S20 of the first layer of the composite member 230, and the fourth layer 242 has the same thickness as the sum of the thickness of the third sheet S30 and the fourth sheet S40. The fourth layer 242 is formed to be wider than the third layer 241.

The third layer 241 and the fourth layer 242 respectively include a resin matrix 28 and a plurality of reinforced fibers 291 and 292. The reinforced fiber 291 of the third layer 241 can be arranged in a first direction, and the reinforced fiber 292 of the fourth layer 242 can be arranged in a second direction. The first direction may or may not be perpendicular to the second direction. FIG. 15 shows the case in which the first direction is perpendicular to the second direction.

A encapsulation substrate 210 can be manufactured by arranging the first layer 231 of the composite member 230 and the third layer 241 of the insulation member 240 in parallel, providing the second layer 232 of the composite member and the fourth layer 242 of the insulation member 240 in parallel thereon, and pressure-baking the four layers by using a hot plate. In this instance, the reinforced fiber 291 of the third layer 241 is provided to cross the reinforced fiber 292 of the fourth layer 242, thereby preventing the insulation member 240 from being bent in a specific direction after the encapsulation substrate 210 is manufactured and increasing planarity of the encapsulation substrate 210.

Figure 16:
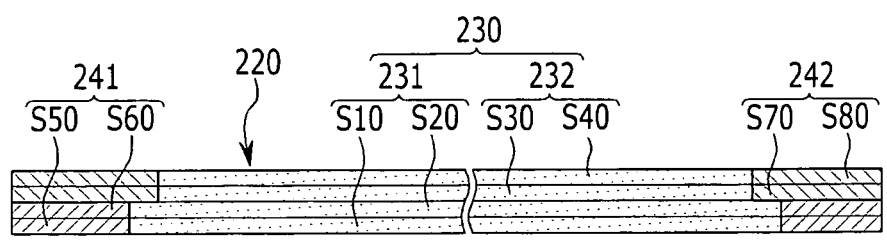
FIG. 16 illustrates a cross-sectional view of a encapsulation substrate of an organic light emitting diode (OLED) display according to another exemplary embodiment.
Figure 17:
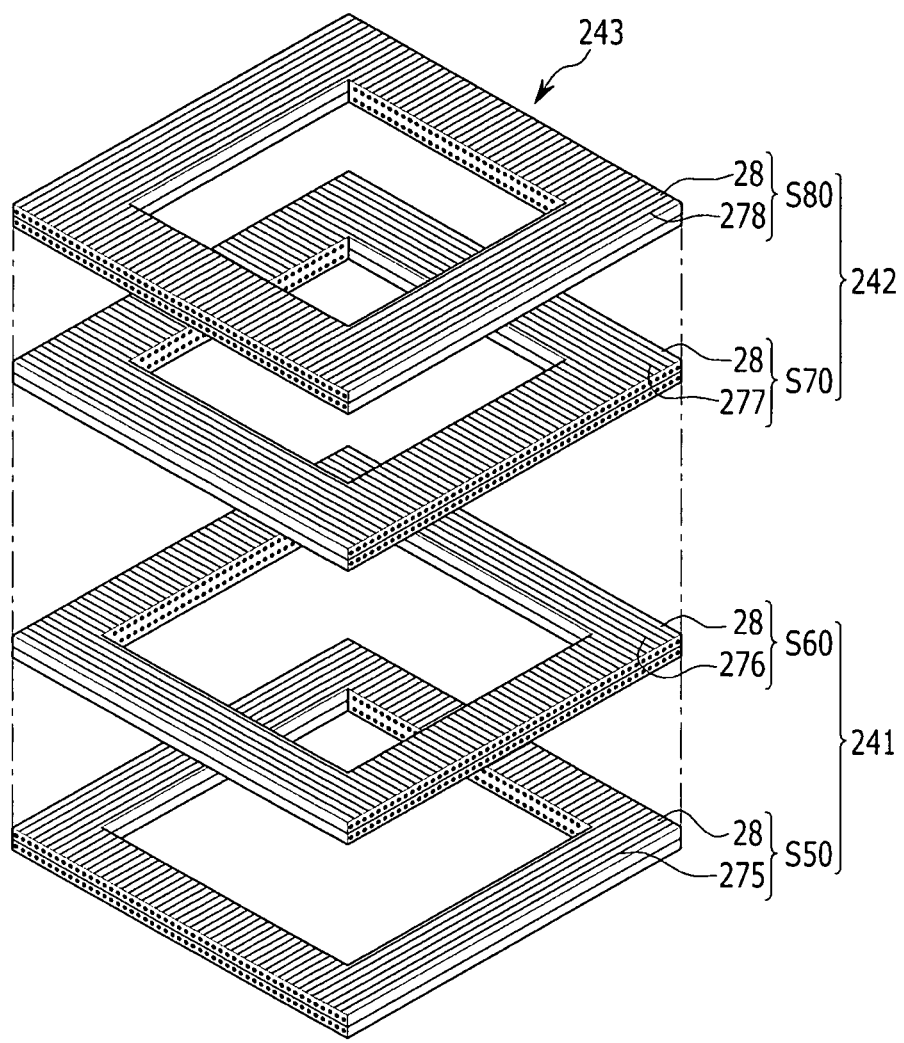
FIG. 17 illustrates an exploded perspective view of an insulation member shown in FIG. 16.

FIG. 16 shows a cross-sectional view of an encapsulation substrate in an organic light emitting diode (OLED) display according to another exemplary embodiment, and FIG. 17 shows an exploded perspective view of the insulation member shown in FIG. 16. For better understanding and ease of description, the first conductor and the second conductor are not illustrated in FIG. 16, and the first through hole and the second through hole are not shown in FIG. 17.

Referring to FIG. 16 and FIG. 17, the organic light emitting diode (OLED) display according to this exemplary embodiment has the same configuration as the organic light emitting diode (OLED) display according to the exemplary embodiment of FIGS. 14-15 except that the third layer and the fourth layer of the insulation member are stacked with a plurality of sheets. The same members as the exemplary embodiment of FIGS. 14-15 will be given the same reference numerals.

The third layer 241 of an insulation member 243 is formed by stacking the fifth sheet S50 and the sixth sheet S60, and the fourth layer 242 is formed by stacking the seventh sheet S70 and the eighth sheet S80. The respective sheets S50, S60, S70, and S80 include a resin matrix 28 and a plurality of reinforced fibers 275, 276, 277, and 278. The fifth to eighth sheets S50, S60, S70, and S80 of the insulation member 243 have the same thickness as the first to fourth sheets S10, S20, S30, and S40 of the composite member 230, and their sides contact each other.

The reinforced fibers 275 and 278 of the fifth sheet S50 and the eighth sheet S80 may be arranged in a first direction, and the reinforced fibers 276 and 277 of the sixth sheet S60 and the seventh sheet S70 may be arranged in a second direction. The first direction may be or may not be perpendicular to the second direction. FIG. 17 shows the case in which the first direction is perpendicular to the second direction.

Particularly, the arrangement direction of the reinforced fibers 275 and 276 of the fifth sheet S50 and the sixth sheet S60 may correspond to the arrangement direction of the carbon fibers 271 and 272 of the first sheet S10 and the second sheet S20, and the arrangement direction of the reinforced fibers 277 and 278 of the seventh sheet S70 and the eighth sheet S80 may correspond to the arrangement direction of the carbon fibers 273 and 274 of the third sheet S30 and the fourth sheet S40. Then, the composite member 230 and the insulation member 243 are prevented from being bent in a specific direction after the encapsulation substrate 220 is manufactured, thereby increasing planarity of the encapsulation substrate 220.

Figure 19:
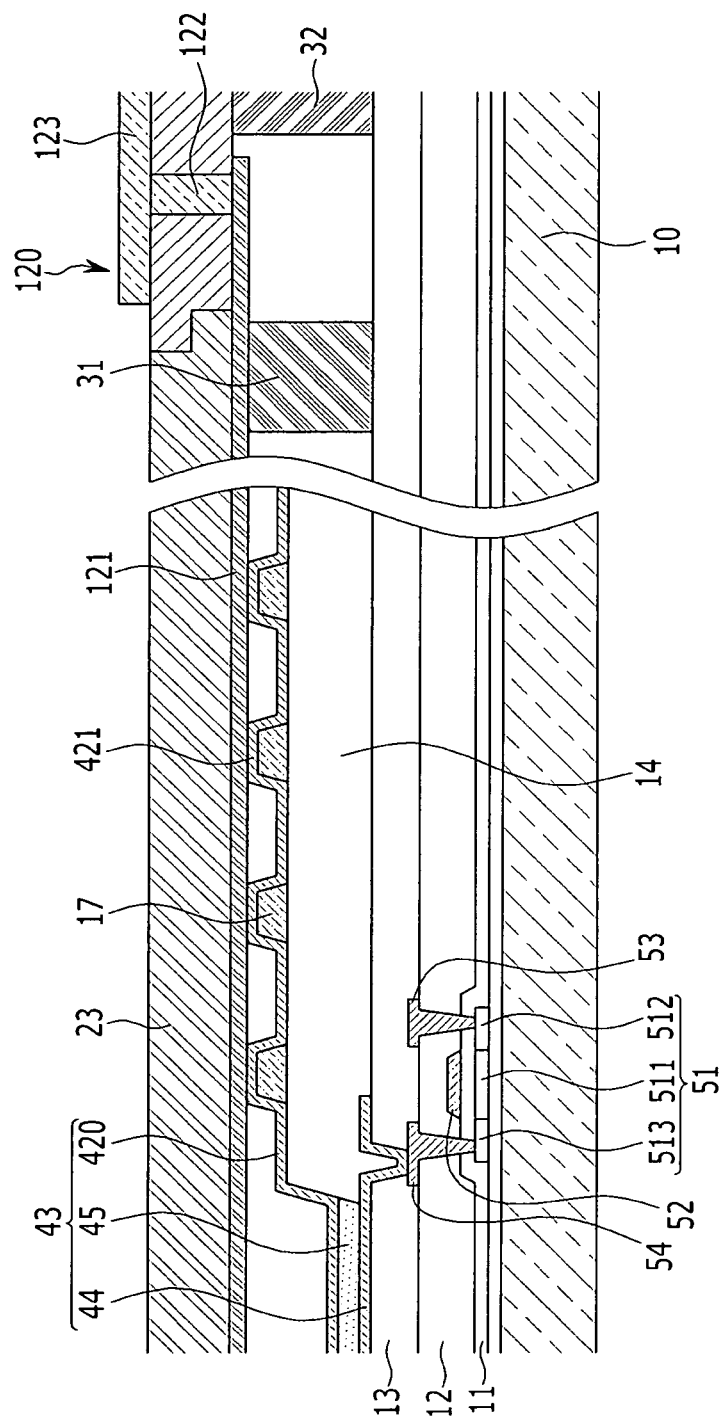
FIG. 19 illustrates a partial enlarged view of an organic light emitting diode (OLED) display shown in FIG. 18.

FIG. 18 shows a cross-sectional view of an organic light emitting diode (OLED) display according to another exemplary embodiment, and FIG. 19 shows a partial enlarged view of an organic light emitting diode (OLED) display shown in FIG. 18.

Referring to FIG. 18 and FIG. 19, the organic light emitting diode (OLED) display 700 according to this exemplary embodiment has the same configuration as one of the organic light emitting diode (OLED) display according to the previous embodiments, except the configuration in which the second pad is omitted and the second inner layer 121 formed on the encapsulation substrate 20 contacts a common electrode 420. FIG. 18 shows the configuration of the exemplary embodiment of FIGS. 1-13 as a basic configuration, and the same members as the exemplary embodiment of FIGS. 1-13 have the same reference numerals.

In the display region A10, the common electrode 420 has a protruded and depressed structure, that is, a plurality of protrusions 421 that are attached to the second inner layer 121 formed on the encapsulation substrate 20. Therefore, the common electrode 420 does not pass through the conductive adhering layer 33 but is directly connected to the second conductor 120 to receive the second electric signal.

The protruded and depressed structure of the common electrode 420 can be provided by a spacer 17. For example, a plurality of spacers 17 may be formed on the pixel definition layer 14, and the common electrode 420 may be formed over the display region A10 while covering the spacers 17. The common electrode 420 is closely attached to the second inner layer 121 and is electrically connected to the second conductor 120 when the substrate 10 and the encapsulation substrate 20 are attached in a pressurized condition.

In the organic light emitting diode (OLED) display 700 according to the this exemplary embodiment, the first pad for applying the first electric signal of the common power line 41 is positioned in the wire and sealing region A20 of the substrate 10. The second inner layer 121 formed on the encapsulation substrate 20 does not include a plurality of the second extended units that are extended to the second pad in the exemplary embodiment of FIGS. 1-13.

In all of the exemplary embodiments described herein, the organic light emitting diode (OLED) display can have a planarization film (not shown) between the first inner layer 111 and the second inner layer 121 and between the first outer layer 113 and the second outer layer 123. In this case, the inner side and the outer side of the encapsulation substrate 20 are formed to be substantially planar. In this instance, the planarization film is formed with an insulation material to insulate the first conductor 110 from the second conductor 120.

By way of summation and review, the function of the display unit including a plurality of organic light emitting elements may deteriorate due to penetration of external moisture and oxygen such that a technology for sealing the display unit to suppress the penetration of external moisture and oxygen is desirable. The described technology has been made in an effort to provide a display device and an organic light emitting diode (OLED) display for improving a sealing function of a display device. The organic light emitting diode (OLED) display according to the described embodiments may enhance a sealing function of the display unit and may increase the luminance uniformity while realizing a large-sized display unit, and may also simplify the entire structure and the manufacturing process by a reduction of the number of parts. Also, a bonding force of the composite member and the insulation member configuring the encapsulation substrate may increased, and a flat encapsulation substrate may be manufactured.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a display substrate;
a display disposed on the display substrate;
an encapsulation substrate affixed to the display substrate by an adhering layer surrounding the display, the encapsulation substrate including a composite member including a resin matrix and a plurality of carbon fibers, and an insulation member coupled to an edge of the composite member and including at least one through hole;
a metal layer positioned on a side of the encapsulation substrate facing the display substrate; and
a conductive connector filling the through hole and contacting the metal layer, wherein
the composite member is stacked with at least two layers having different sizes, and the insulation member contacts sides of the at least two layers and has a same thickness as the composite member.

2. The display device as claimed in claim 1, wherein the carbon fibers cross each other in the resin matrix.

3. The display device as claimed in claim 1, wherein:
the composite member includes a first layer and a second layer having different sizes,
the first layer and the second layer of the composite member are configured with a plurality of sheets, and
the sheets each include the resin matrix and the plurality of carbon fibers.

4. The display device as claimed in claim 3, wherein carbon fibers disposed in at least one of the plurality of sheets and carbon fibers disposed in at least another one of the plurality of sheets cross each other.

5. The display device as claimed in claim 4, wherein:
the insulation member includes a third layer that contacts the first layer of the composite member and that is in parallel with the first layer and a fourth layer that contacts the second layer of the composite member and that is parallel with the second layer, and
the third layer and the fourth layer respectively of the insulation member include a resin matrix and a plurality of reinforced fibers.

6. The display device as claimed in claim 5, wherein reinforced fibers disposed in the third layer of the insulation member and reinforced fibers disposed in the fourth layer of the insulation member cross each other.

7. The display device as claimed in claim 5, wherein:
the third layer and the fourth layer of the insulation member are configured with a plurality of sheets,
the sheets each include a resin matrix and a plurality of reinforced fibers, and
reinforced fibers disposed in at least one of the plurality of sheets and reinforced fibers disposed in at least another one of the plurality of sheets cross each other.

8. The display device as claimed in claim 1, wherein:
the insulation member includes one of plastic, glass, and a reinforced fiber composite material, and
reinforced fiber of the reinforced fiber composite material includes one of a glass fiber and an aramid fiber.

9. The display device as claimed in claim 1, wherein:
the insulation member has a first through hole and a second through hole, and
the display device further includes:
a first conductor disposed over an inner side and an outer side of the encapsulation substrate and through the first through hole, the first conductor being for receiving a first electric signal; and
a second conductor disposed over an inner side and an outer side of the encapsulation substrate and through the second through hole, the second conductor being for receiving a second electric signal.

10. An organic light emitting diode (OLED) display, comprising:
a display substrate;
a display disposed on the display substrate and including a common power line and a common electrode;
an encapsulation substrate attached to the display substrate by an adhering layer surrounding the display, the encapsulation substrate including a composite member including a resin matrix and a plurality of carbon fibers, and an insulation member coupled to an edge of the composite member and forming a first through hole and a second through hole;
a first conductor on an inner side and an outer side of the encapsulation substrate and through the first through hole, the first conductor being for supplying a first electric signal to the common power line; and
a second conductor an inner side and an outer side of the encapsulation substrate and through the second through hole, the second conductor being for supplying a second electric signal to the common electrode, wherein
the composite member is stacked with at least two layers having different sizes, and the insulation member contacts sides of the at least two layers and has a same thickness as the composite member.

11. The OLED display as claimed in claim 10, further comprising:
a pad positioned peripherally outward from the display, and including a first pad connected to the common power line and a second pad connected to the common electrode; and
a conductive adhering layer positioned between the first pad and the first conductor and between the second pad and the second conductor.

12. The OLED display as claimed in claim 11, wherein:
the common power line includes a first common power line and a second common power line crossing each other, and
the first pad and the second pad are alternately and repeatedly disposed in a direction of the substrate.

13. The OLED display as claimed in claim 11, wherein the conductive adhering layer has electrical conductivity in a thickness direction, and has an insulation characteristic in a direction other than the thickness direction.

14. The OLED display as claimed in claim 10, further including a first pad positioned on an outer part of the display and connected to the common power line, and a conductive adhering layer positioned between the first pad and the first conductor, wherein the second conductor is attached to the common electrode.

15. The OLED display as claimed in claim 14, further including:
a plurality of spacers positioned on the bottom of the common electrode in the display, wherein
the common electrode has a protrusion corresponding to the spacer.

16. The OLED display as claimed in claim 10, wherein:
the first conductor includes a first inner layer on an inner part of the insulation member, a first connector filling in the first through hole, and a first outer layer on an outer part of the insulation member, and
the second conductor includes a second inner layer over an inner part of the insulation member and an inner part of the composite member, a second connector filling in the second through hole, and a second outer layer on an outer part of the insulation member.

17. The OLED display as claimed in claim 16, wherein:
the second inner layer contacts the adhering layer and faces the display, and
the first inner layer is positioned to be separate from the second inner layer on the outer part of the second inner layer.

18. The OLED display as claimed in claim 17, wherein the second inner layer includes a metal foil including aluminum or copper.

19. The OLED display as claimed in 10, wherein:
the composite member includes a first layer and a second layer with different sizes,
the first layer and the second layer of the composite member are configured with a plurality of sheets, and
the sheets each include the resin matrix and the plurality of carbon fibers.

20. The OLED display as claimed in claim 19, wherein carbon fibers disposed in at least one of the plurality of sheets and carbon fibers disposed in at least another one the plurality of sheets cross each other.

21. The OLED display as claimed in claim 20, wherein:
the insulation member includes a third layer that contacts the first layer and that is parallel with the first layer, and a fourth layer that contacts the second layer and that is parallel with the second layer, and
the third layer and the fourth layer of the insulating member each include a resin matrix and a plurality of reinforced fibers.

22. The OLED display as claimed in claim 21, wherein reinforced fibers disposed in the third layer of the insulating member and reinforced fibers disposed in the fourth layer of the insulating member cross each other.

23. The OLED display as claimed in claim 21, wherein:
- the third layer and the fourth layer of the insulation member are configured with a plurality of sheets,
- the sheets each include a resin matrix and a plurality of reinforced fibers, and
- reinforced fibers disposed in at least one of the plurality of sheets and reinforced fibers disposed in at least another one of the plurality of sheets cross each other.

* * * * *